(12) United States Patent
Stevens

(10) Patent No.: US 6,583,061 B2
(45) Date of Patent: Jun. 24, 2003

(54) METHOD FOR CREATING AN ANTI-BLOOMING STRUCTURE IN A CHARGE COUPLED DEVICE

(75) Inventor: Eric G. Stevens, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/944,548

(22) Filed: Aug. 31, 2001

(65) Prior Publication Data
US 2003/0045109 A1 Mar. 6, 2003

(51) Int. Cl.[7] .............................................. H01L 21/311
(52) U.S. Cl. ........................ 438/700; 438/702; 438/724
(58) Field of Search .................................. 438/75, 76, 144, 438/700, 702, 724, 725; 257/215, 230

(56) References Cited

U.S. PATENT DOCUMENTS

| | | | | | |
|---|---|---|---|---|---|
| 4,774,557 A | * | 9/1988 | Kosonocky | ................. | 257/222 |
| 5,130,774 A | * | 7/1992 | Stevens et al. | ............. | 257/445 |
| 5,702,971 A | * | 12/1997 | Stevens | ....................... | 438/79 |
| 5,798,542 A | * | 8/1998 | Anagnostopoulos et al. | ......................... | 257/232 |
| 5,804,844 A | * | 9/1998 | Anagnostopoulos | ........ | 257/223 |
| 6,051,852 A | * | 4/2000 | Stevens | ....................... | 257/223 |
| 6,266,087 B1 | * | 7/2001 | Hynecek et al. | ............ | 348/249 |
| 6,369,413 B1 | * | 4/2002 | Hynecek | .................... | 257/215 |

* cited by examiner

Primary Examiner—Kin-Chan Chen
(74) Attorney, Agent, or Firm—Peyton C. Watkins

(57) ABSTRACT

A method of creating a lateral overflow drain, anti-blooming structure in a charge coupled device, the method includes steps for self-aligning a peripheral edge of the lateral overflow drain to an edge of the thick field oxide, whereby the overflow drain is substantially covered by the field oxide.

4 Claims, 2 Drawing Sheets

METHOD FOR CREATING AN ANTI-BLOOMING STRUCTURE IN A CHARGE COUPLED DEVICE

FIELD OF THE INVENTION

The invention relates generally to the field of image sensors and, more particularly, to such image sensors having the edge of a lateral overflow drain self aligned to a gate of the field oxide layer.

BACKGROUND OF THE INVENTION

Currently known and utilized full frame image sensors, such as in U.S. Pat. No. 5,130,774, include lateral overflow drains for preventing blooming, as is well known in the art. These drains are typically formed underneath the CCD gate electrodes and are limited in performance by surface breakdown. This is because, as the dose of the drain is increased to improve its conductivity, it's breakdown voltage drops. Therefore, there is a maximum dose and correspondent maximum amount of drain-limited blooming protection that can be provided for a given minimum tolerable breakdown voltage for any given device process.

To avoid this surface breakdown limitation, the drain can be placed underneath the thick field oxide that is typically used for channel-to-channel isolation between the vertical CCDs of these devices as described in U.S. patent application Ser. No. 09/945,034, A LATERAL OVERFLOW DRAIN, ANTI-BLOOMING STRUCTURE FOR CCD DEVICES HAVING IMPROVED BREAKDOWN VOLTAGE, by Edmund K Banghart and Eric G. Stevens. By placing the field oxide layer over the lateral overflow drain, the surface electric field is reduced in inverse proportion to the thickness. In implementing such a device, the lateral overflow drain should be aligned to the edge of the field oxide later. If the drain is not fully covered by the field oxide later, its breakdown voltage will be reduced and limited by the portion of the drain that protrudes out beneath the thinner gate dielectric. If, on the other hand, the drain is placed too far underneath the field oxide layer, connection to it via the buried channel may be lost. This is because the buried channel is typically self-aligned to the field oxide edge by implanting it after the field oxide growth. This may render the structure nonfunctional. Although the latter limitation could be eliminated by implanting the buried channel prior to the growth of the field oxide layer, the former problem would still exist.

Consequently, a need exists for overcoming the above-described shortcomings by providing a process wherein the lateral overflow drain is underneath and self aligned to one edge of the field oxide layer.

SUMMARY OF THE INVENTION

The present invention is directed to overcoming one or more of the problems set forth above. Briefly summarized, according to one aspect of the present invention, the invention resides in a method for creating a lateral overflow drain, anti-blooming structure in a charge coupled device, the method comprising the steps of (a) providing a substrate of a first conductivity type for the charge coupled device; (b) providing a layer of oxide abutting the substrate; (c) providing a layer of nitride abutting the oxide; (d) providing a hard mask abutting the nitride with an etched away portion having a dimension which substantially equals a combined dimension of heavily doped first and second conductivity type subsequently implanted regions in the substrate; (e) placing photoresist in a portion of the etched away portion which remaining etched away portion includes a dimension substantially equal to the first conductivity type subsequently implanted region in the substrate; (f) implanting ions of the first conductivity type through the remaining etched away portion and into the substrate for creating a channel stop; (g) removing the photoresist and placing a second photoresist layer in a portion of the etched away portion wherein a remaining etched away portion includes a dimension substantially equal to the second conductivity type subsequently implanted region in the substrate and wherein the remaining etched away portion is adjacent the implanted channel stop; (h) implanting ions of the second conductivity type through the remaining etched away portion and into the substrate for forming the lateral overflow drain; (i) etching a portion of the nitride so that a peripheral portion of the etched away portion is substantially aligned with a peripheral portion of the second conductivity type; (j) growing a thick field oxide in the etched away portion of the nitride layer so that the lateral overflow drain is covered by the thick field oxide layer.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The present invention has the following advantage of self-aligning a peripheral edge of the lateral overflow drain to an edge of the field oxide, whereby the overflow drain is substantially fully covered by the field oxide.

DETAILED DESCRIPTION OF THE INVENTION

Figure 1:
FIG. 1 is a view in cross section of an initial stage in the process of creating an image sensor of the present invention.

Referring to FIG. 1, there is shown a cross sectional view of the initial phase of creating a full-frame image sensor 10 of the present invention. The image sensor 10 includes a substrate 20 having a 300 angstrom thick (for example) layer of oxide 30 thereon, and a 300 angstrom thick (for example) layer of nitride 40 deposited on the oxide layer. A hard mask 50, preferably low temperature oxide although any suitable substitute may be used, is placed over the nitride 40, and a first, removable layer of photoresist 60 is deposited on the hard mask 50.

Figure 2:
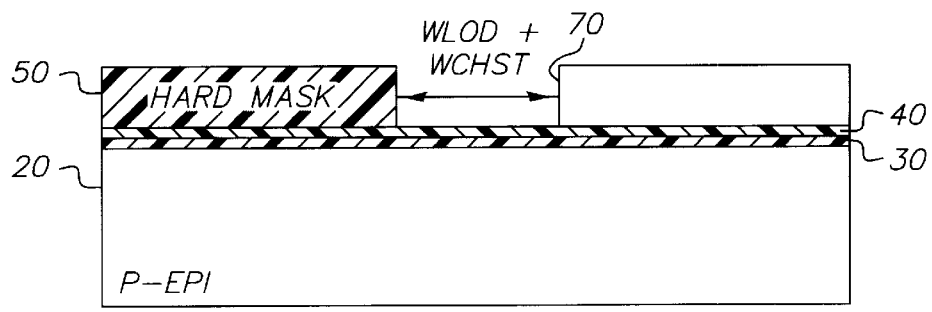
FIG. 2 is a view in cross section of a subsequent stage of FIG. 1.

In going from FIG. 1 to FIG. 2, the photoresist 60 is patterned and the hard mask 50 is etched with an opening 70 whose width $W_{lod}+W_{chst}$ substantially equals the combined width of the to-be-implanted channel stop and lateral overflow drain. The remaining photoresist 60 is then removed.

Figure 3:
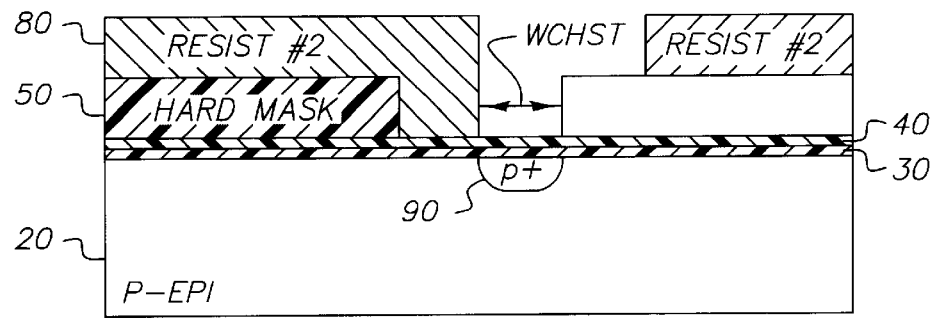
FIG. 3 is a view in cross section of a subsequent stage of FIG. 2.

Referring to FIG. 3, a second, removable layer of photoresist 80 is deposited on a portion of the hard mask 50 and in a portion of the etched-out area 70 and atop the nitride 40. As may be apparent to those skilled in the art, the thickness of the photoresist 80 and hard mask 50 are of sufficient thickness to block the subsequent implants. The dimension $W_{chst}$ is substantially equal to the width of the heavily doped, p-type channel stop 90 which is then implanted in the substrate 20.

Figure 4:
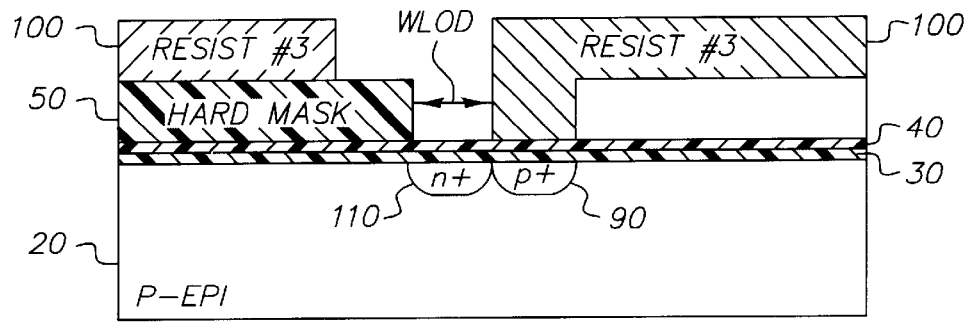
FIG. 4 is a view in cross section of a subsequent stage of FIG. 3.

Referring to FIG. 4, the second layer of photoresist 80 is removed and a third, removable layer of photoresist 100 is patterned over the hard mask 50 which is adjacent the channel stop 90 and in the etched-out portion 70 over the channel stop 90. The lateral overflow drain 110 is then implanted in the substrate 20 via a heavily doped n type conductivity.

Figure 5:
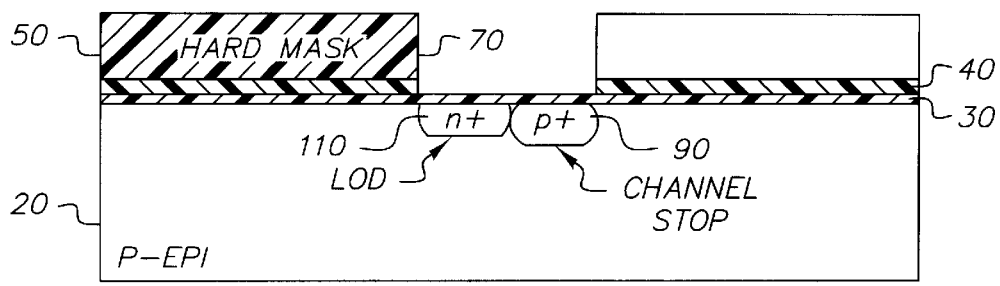
FIG. 5 is a view in cross section of a subsequent stage of FIG. 4.
Figure 6:
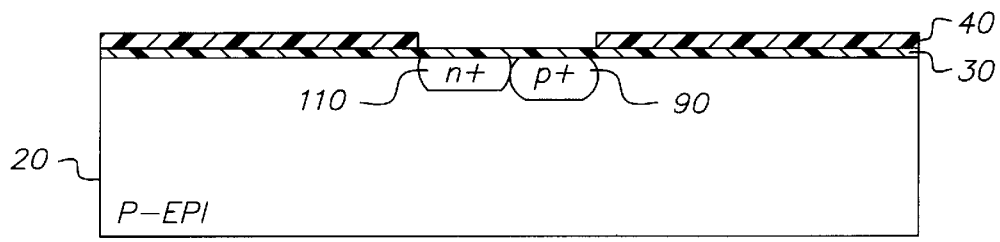
FIG. 6 is a view in cross section of a subsequent stage of FIG. 5.

Referring to FIG. 5, the photoresist 100 is removed, and the nitride layer 40 is etched so that the channel stop 90 and lateral overflow drain 110 are exposed via opening 75. Those skilled in the art may recognize that the nitride layer 40 may be etched in a previous stage of the process, the etching at this stage is only the preferred embodiment. It is instructive to note that a peripheral portion of the etched away portion is substantially aligned with a peripheral portion of the lateral overflow drain. Referring briefly to FIG. 6, the hard mask 70 is removed.

Figure 7:
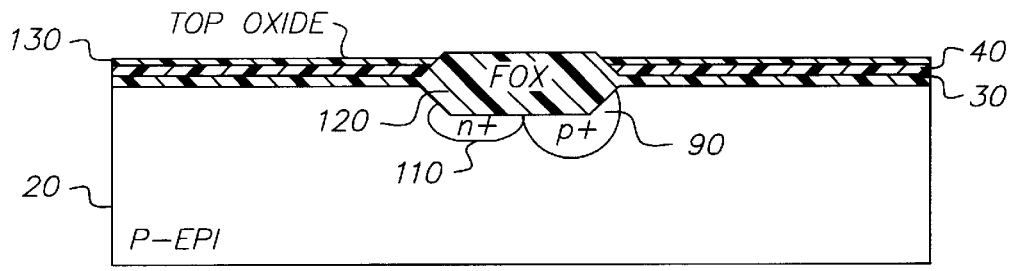
FIG. 7 is a view in cross section of a subsequent stage of FIG. 6.
Figure 8:
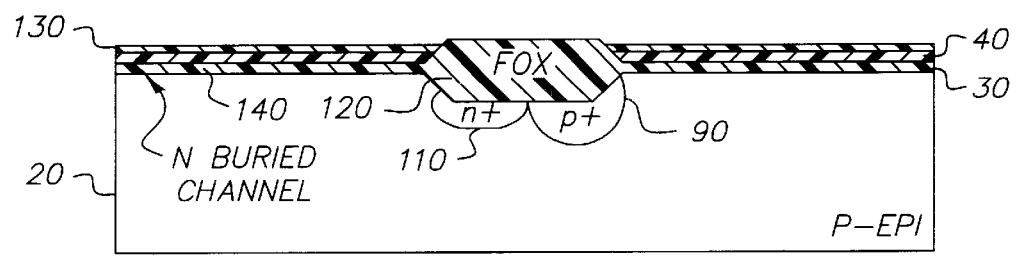
FIG. 8 is a view in cross section of a subsequent stage of FIG. 7.
Figure 9:
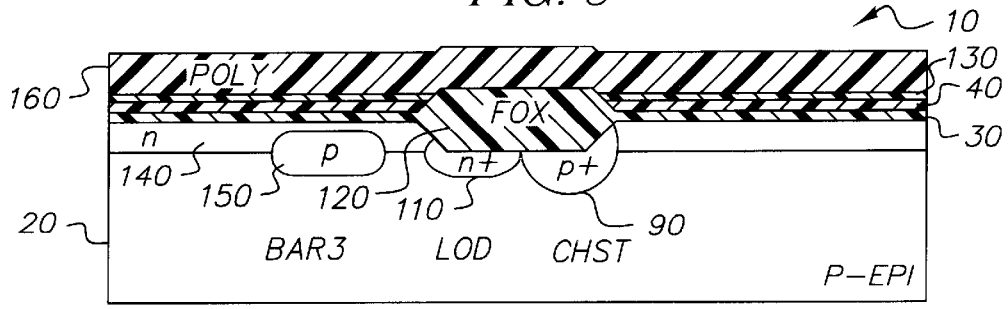
FIG. 9 is a view in cross section of the final stage of creating the image sensor of the present invention.

In going from FIG. 6 to FIG. 7, a thick field oxide 120 is grown in the opening 75 of the nitride layer 40 on top of substrate 20. As used herein thick field oxide means a field oxide layer that is thicker than the ONO layers. At the same time as the field oxide is grown, a top-gate oxide layer 130 is grown on nitride layer 40, thereby completing the oxide-nitride-oxide (ONO) gate dielectric stack. Referring to FIG. 8, a buried channel (n type conductivity) 140 is implanted and well-known techniques are used for completing the image sensor 10 as shown in FIG. 9. As can be readily seen, the completed image sensor 10 includes a barrier (p type conductivity) 150 for forming a barrier over which the overflow charges will flow, and a polysilicon top layer gate electrode 160.

The invention has been described in detail with particular reference to certain preferred embodiments thereof, but it will be understood that variations and modifications can be effected within the spirit and scope of the invention.

For example, although this invention has been described using a p-type silicon substrate and channel stops with an n-type buried channel and overflow drain, an n-type substrate could be used by using the opposite conductivity types for the various other implants. Also, other gate electrode materials, such as indium-tin oxide, could be used. It is also to be understood that, although the drawings showing only one CCD and its corresponding lateral, there are a plurality of such CCDs and their corresponding lateral overflow drain, anti-blooming structure.

PARTS LIST 10 image sensor
20 substrate
30 oxide
40 nitride
50 hard mask
60 photoresist
70 opening
75 opening
80 photoresist
90 channel stop
100 photoresist
110 lateral overflow drain
120 filed oxide
130 top-gate oxide layer
140 buried channel
150 barrier
160 polysilicon

What is claimed is:

1. A method for creating a lateral overflow drain, anti-blooming structure in a charge coupled device, the method comprising the steps of:

(a) providing a substrate of a first conductivity type for the charge coupled device;

(b) providing a layer of oxide abutting the substrate;

(c) providing a layer of nitride abutting the oxide;

(d) providing a hard mask abutting the nitride with an etched away portion having a dimension which substantially equals a combined dimension of heavily doped first and second conductivity type subsequently implanted regions in the substrate;

(e) placing photoresist in a portion of the etched away portion which remaining etched away portion includes a dimension substantially equal to the first conductivity type subsequently implanted region in the substrate;

(f) implanting ions of the first conductivity type through the remaining etched away portion and into the substrate for creating a channel stop;

(g) removing the photoresist and placing a second photoresist layer in a portion of the etched away portion wherein a remaining etched away portion includes a dimension substantially equal to the second conductivity type subsequently implanted region in the substrate and wherein the remaining etched away portion is adjacent the implanted channel stop;

(h) implanting ions of the second conductivity type through the remaining etched away portion and into the substrate for forming the lateral overflow drain;

(i) etching a portion of the nitride so that a peripheral portion of the etched away portion is substantially aligned with a peripheral portion of the second conductivity type;

(j) growing a thick field oxide in the etched away portion of the nitride layer so that the lateral overflow drain is covered by the thick field oxide layer.

2. The method as in claim 1 further comprising the step of providing p type as the first conductivity type.

3. The method as in claim 1 further comprising the step of providing a buried channel of the second conductivity type within the substrate between channel stops.

4. The method as in claim 3 further comprising the step of providing a barrier region, disposed adjacent the lateral overflow drain on a side opposite the channel stop and within the substrate, so that a net impurity concentration in the barrier region is less than that of the buried channel.

* * * * *